United States Patent [19]

Bleeker et al.

[11] Patent Number: 5,268,579
[45] Date of Patent: Dec. 7, 1993

[54] MONOPOLE MAGNETIC LENS FIELD

[75] Inventors: Arno J. Bleeker; Pieter Kruit, both of Delft, Netherlands

[73] Assignee: U.S. Philips Corp., New York, N.Y.

[21] Appl. No.: 741,026

[22] Filed: Aug. 6, 1991

[30] Foreign Application Priority Data

Aug. 9, 1990 [EP] European Pat. Off. ........ 90202161.7

[51] Int. Cl.[5] .......................................... H01V 37/141
[52] U.S. Cl. .................. 250/396 ML; 250/310; 250/398
[58] Field of Search ................. 250/396 ML, 398, 310

[56] References Cited

U.S. PATENT DOCUMENTS

| | | | |
|---|---|---|---|
| 3,509,503 | 4/1970 | Yanaka et al. | 335/210 |
| 4,384,208 | 5/1983 | Tsuno | 250/396 ML |
| 4,565,877 | 1/1986 | Ezaki et al. | 360/114 |
| 4,771,350 | 9/1988 | Desserre | 360/123 |
| 4,808,821 | 2/1989 | Feuerbaum et al. | 250/305 |

Primary Examiner—Jack I. Berman
Attorney, Agent, or Firm—William L. Botjer

[57] ABSTRACT

In an electron optical system a monopole shaped magnetic field is introduced enabling an aberration free imaging writing or detection in the system. Apparatus based on this field distribution result in improved secondary electron detection such as for chip inspection, in improved resolution in Auger electron detection for analysis, in a higher exactness in chip production in an electron beam pattern generator and in an electron beam image projector in which now also size reduction can aberration free be introduced.

1 Claim, 1 Drawing Sheet

MONOPOLE MAGNETIC LENS FIELD

BACKGROUND OF THE INVENTION

The invention relates to an electron beam apparatus provided with an electron collecting element for collecting electrons extracted from an electron emanating element and with means for generating a magnetic field in front of at least one of said elements.

Electron beam apparatus of this kind may be provided with an object to be examined such as a specimen or a chip. Such an object may be irradiated with electrons generated by an electron source and electrons emanating from the object are, preferably energy dependent, detected. Secondary electron-, reflected electron- or especially Auger electron detecting instruments as well as chip inspecting instruments belong to this kind of apparatus. In other apparatus a target such as a semi-conductor wafer becomes irradiated with electrons in order to register integrated circuit patterns therein. Electron beam pattern generators and electron beam image projectors are examples of this kind of apparatus. In image projectors electrons are extracted from a structured device such as a master chip. For chip production with an electron beam liberated from the master chip a semi-conductor wafer is irradiated in order to image the pattern of the master chip thereupon. The electrons may be liberated from the master chip with the help of a photo emitter provided on the structure thereof. In an electron beam pattern apparatus an electron beam extracted from an electron emitting cathode tip is used for producing a chip or a chip master, the latter for subsequent use in an image projector for example.

All these apparatus suffer from axial and non-axial aberrations enlarging the measuring of the electron probe and deteriorating the exactness of secondary electron detection.

SUMMARY OF THE INVENTION

It is an object of this invention to reduce these aberrations. To achieve this, an apparatus set forth in accordance with the invention is characterized in that, the magnetic field in front of the electron emanating element or the electron collecting element has a field strength which decreases away from a surface of said element substantially monopole shaped.

Magnetic fields which vary monopole shaped as defined have the advantage that electrons created in such a field at a location of high field strength become, passing through that field, adiabatic parallellizeol. This results in an electron path close about a field line on which the electron has been started from the relevant surface of the object. Due to the monopole shaped field distribution such a field line is a straight line here.

In a preferred embodiment a monopole shaped magnetic field distribution is realised between two elements having the shape of parts of concentrically arranged spheres such that a first element functions as object from which electrons will be emanated and a second element functions as collecting element. Between the two elements a monopole shaped magnetic field can be introduced of which an effective monopole coincides with the common central point of the two elements. In such a system aberration free imaging can be realised from the first element to the second element with if desired substantially reduced dimensions. Here the electron emanating element can be a master chip, an integrated circuit pattern of which can be imaged on a wafer as second element on a reduced scale with the aid of an electron beam liberated from the master wafer.

In a further embodiment a monopole shaped magnetic field distribution is created basically with the aid of two pole piece structures arranged about a common central axis. A first pole piece structure of the arrangement having an opening substantially large compared with a relative small opening of a second pole piece structure of the arrangement. A magnetic field can be realised between and within said pole pieces increasing very steep in front of the second pole piece and decreasing subsequently monopole shaped in the direction of and eventually within the first pole piece structure. An object to be irradiated or examined is preferably located in a region where the magnetic field strength shows a maximum value being just in front of the second pole piece. Electrons liberated from such an object spirallize through the first magnetic pole piece structure and can be detected on a reverse side thereof as described in DE 3 590 146. A monopole field in such a system can be improved with a coil, for example wound around a liner tube in the first pole piece structure.

In such a system the strength of the magnetic field, the geometry of especially the first pole piece structure and the velocity of a primary electron beam can be adapted to one another in that the primary beam forms subsequent crossovers when running to the object through the monopole shaped field. Use is thus made of the property of such a field distribution that therein subsequent crossovers, in the primary beam, can be introduced without any additional beam aberration.

A monopole shaped field can also be created with a coil adapted for producing a relatively high magnetic field strength for example a coil manufactured with superconductive coil windings. Such a coil system can be used in an image projector as indicated and more generally disclosed in U.S. Pat. No. 4,902,930.

In a further embodiment a beam deflection system is incorporated in the apparatus having its pivot point coinciding substantially with an effective monopole centre of a monopole field to be generated in the apparatus. A pivoted electron path than always coincides with a field line of the monopole field and thus do not suffer of aberrations there.

BRIEF DESCRIPTION OF THE DRAWING

Some embodiments of the invention will be described in more detail with reference to the accompanying drawing in which.

DETAILED DESCRIPTION OF THE PREFERRED EMBODIMENT

Figure 1:
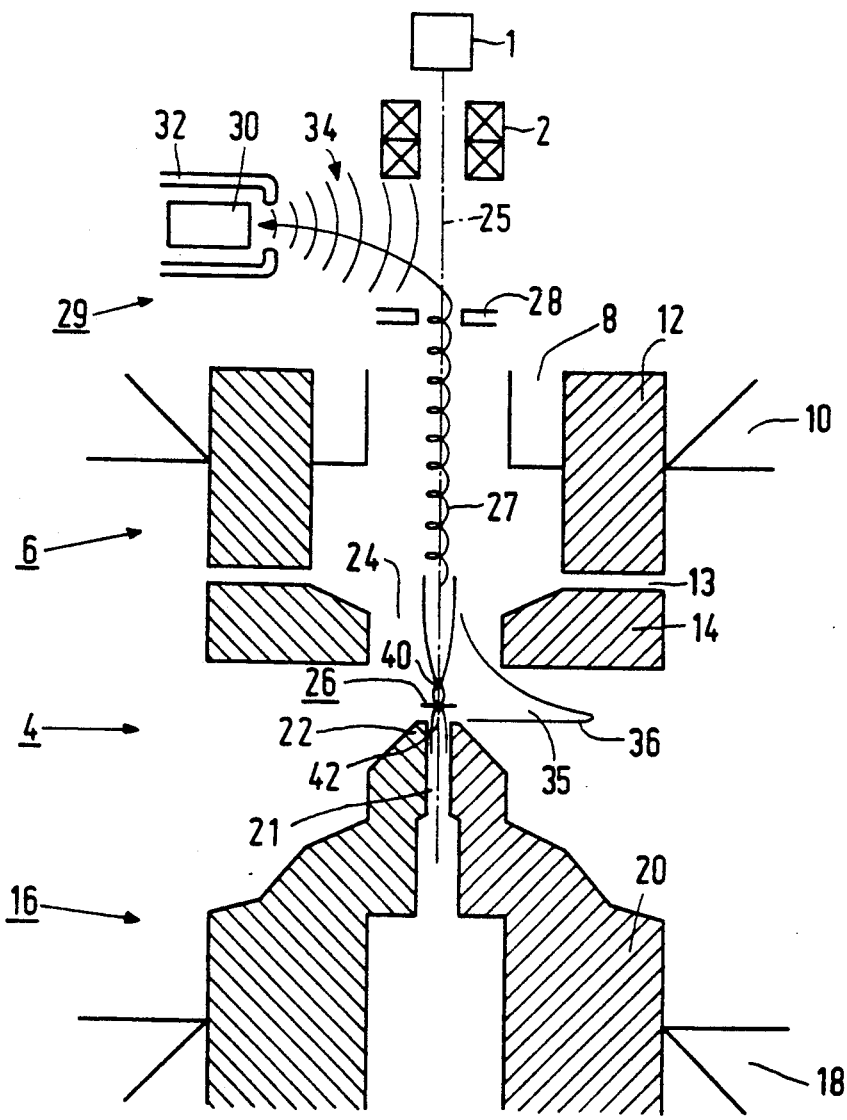
FIG. 1 shows schematically a magnetic pole piece system for generating a monopole shaped magnetic field and FIG. 2 shows schematically an electro magnetic coil system for generating such a field.

An electron optical system indicated in FIG. 1 shows an electron source 1, a beam deflection system 2 and a magnetic lens system 4 with a first pole piece structure 6 having, here arranged around a liner tube coil 8, a mean coil 10 provided with a mean magnetic jig 12 and a second magnetic jig 14 the latter being magnetically uncoupled from the main jig 12 by a non-magnetic interruption 13 providing a magnetic field flux jump there. The lens system 4 shows further a second pole piece structure 16 with a magnetic coil 18 and a magnetic jig 20 provided with a narrow central hole 21 and a sharp pointed pole conus 22 facing the first pole piece structure 6. A control hole 24 of the first pole piece structure 6 is relatively wide compared with the hole 21. An electron beam 25 emanating from the electron source 1 is directed to an object 26 and for example Auger electrons 27 emanated from the object are directed back through the lens system 4. After passing a magnetic diaphragm 28 the electrons are directed to an electron detecting system 29 comprising for example a semi-conductor detector 30 provided with an electrode 32 for introducing an electrostatic collecting field 34. The lens system 4 is dedicated to provide a magnetic field 35 increasing running with the primary beam 25 monopole shaped up to a maximum value 36 where or in front of which the object 26 is arranged and subsequently decreasing relatively fast up to the second pole piece structure. Electrons 27 escaping from the object and thus starting in a high magnetic field strength regio are spirallized through the lens system up to the magnetic diaphragm 28 after which they are bend to the detector as described in EP 340 861. The primary beam 25 shows here an extra crossover 40, if appropriate more crossovers can be introduced in order to bridge the relatively long travelling path necessary for the relatively low energy electrons.

A monopole field distrubution in such a lens structure can be used as indicated for detecting Auger electrons which are specific for the elements present in the object. It can also be used for detecting secundary electrons, reflected electrons etc. and for chip inspection with the aid of secundary electrons. Especially for chip inspection the electron detection is preferably to be made energy sensitive.

In this system the beam deflecting system 2 can be used to pivot the primary electron beam about a point 42 coinciding with the effective monopole field centre of the monopole field in front of the prevented from all electron optical aberrations. The structure can also be used for electron beam projection in that for example a master chip is arranged somewhere in or in front of the first pole piece structure and electrons emanating there from are imaged on a wafer located at the position of object 26.

Figure 2:
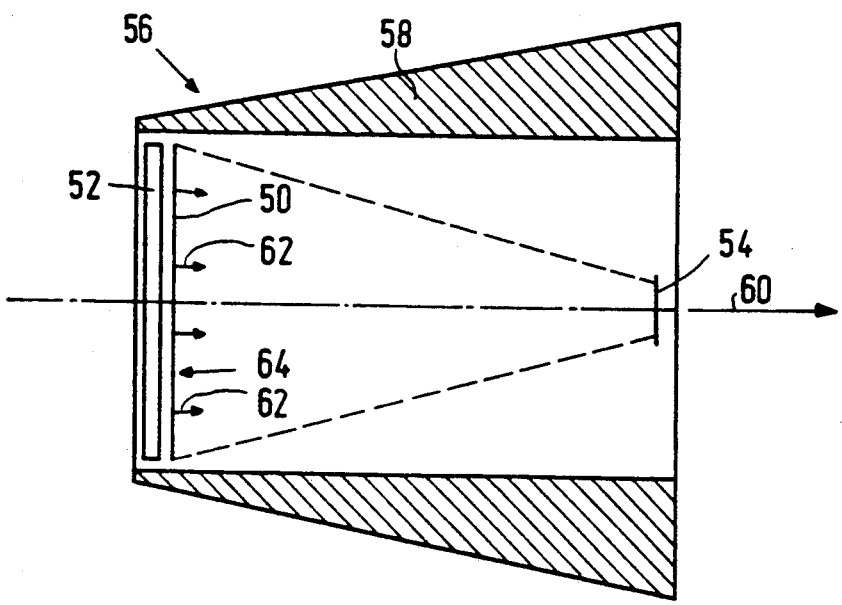

FIG. 2 shows another embodiment for an image projecting system. Here a master chip 50 provided with a light source 52 and a wafer 54 are arranged in a monopole shaped magnetic field created by an electromagnetic coil system 56 provided with a coil winding distribution 58 varying in an axial direction 60 of the coil system. Electrons 62 liberated from the master chip with the aid of a photocathode 64 provided on the master chip and activated by the light source 52 are aberration free imaged on the wafer 54 through the monopole field. A substantial advantage of such a system is that adjustable size reduction can be introduced. This opens the possibility to work with a relatively large, and thus relatively easy exact to produce, master chip.

We claim:

1. Electron beam apparatus for examining an object with an electron beam comprising:
   means for generating an electron beam;
   means for shaping said electron beam;
   said electron beam shaping means comprising a first pole piece and a second pole piece;
   means for positioning the object to be examined between said first and second pole pieces;
   said first pole piece having first and second parts, said first part including an opening that is relatively large compared with the opening in said second part, said first and second parts being magnetically separated by a non-magnetic interruption; and
   said second pole piece having a diverging tip and an opening which is smaller than the opening of said second part of said first pole piece.

* * * * *